(12) United States Patent
Chen et al.

(10) Patent No.: US 12,176,915 B1
(45) Date of Patent: Dec. 24, 2024

(54) TIME SIGNAL PROCESSOR BASED ON MULTIPLYING PHASE INTERPOLATION CIRCUIT

(71) Applicant: BEIJING UNIVERSITY OF TECHNOLOGY, Beijing (CN)

(72) Inventors: Zhijie Chen, Beijing (CN); Xiaoyu Zhang, Beijing (CN); Peiyuan Wan, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 0 days.

(21) Appl. No.: 18/741,910

(22) Filed: Jun. 13, 2024

Related U.S. Application Data

(63) Continuation of application No. PCT/CN2023/117651, filed on Sep. 8, 2023.

(30) Foreign Application Priority Data

Jul. 23, 2023 (CN) .......................... 202310903661.4

(51) Int. Cl.
*H03M 1/38* (2006.01)
*G04F 10/00* (2006.01)
*H03K 5/13* (2014.01)
*H03K 19/20* (2006.01)

(52) U.S. Cl.
CPC ............ *H03M 1/38* (2013.01); *G04F 10/005* (2013.01); *H03K 5/13* (2013.01); *H03K 19/20* (2013.01)

(58) Field of Classification Search
CPC .......... H03M 1/38; G04F 10/005; H03K 5/13; H03K 19/20

USPC .......................................................... 341/161
See application file for complete search history.

(56) References Cited

U.S. PATENT DOCUMENTS

| | | | | |
|---|---|---|---|---|
| 7,928,888 B1* | 4/2011 | Chiu | ..................... | G04F 10/005 341/161 |
| 7,932,847 B1* | 4/2011 | Hsieh | ..................... | G04F 10/005 341/155 |
| 2011/0084863 A1* | 4/2011 | Chiu | ..................... | G04F 10/005 341/166 |
| 2015/0381192 A1* | 12/2015 | Yamamoto | .......... | H03M 1/1038 341/120 |
| 2017/0293265 A1* | 10/2017 | Salle | .................... | H03M 1/1009 |

FOREIGN PATENT DOCUMENTS

| | | | |
|---|---|---|---|
| CN | 103067016 A | | 4/2013 |
| CN | 107872226 A | | 4/2018 |
| CN | 109861691 A | | 6/2019 |
| CN | 112165329 A | | 1/2021 |

(Continued)

*Primary Examiner* — Jean B Jeanglaude
(74) *Attorney, Agent, or Firm* — Bayramoglu Law Offices LLC (57) ABSTRACT

A time signal processor based on multiplying phase interpolation circuit is provided. The time signal processor includes a time signal processing circuit, a calibration circuit and a digital logic circuit, and realizes a time input signal-digital output signal conversion process. The time signal processing circuit quantizes an input time signal to obtain a series of digital code output; feedback compensation is carried out on the time signal processing circuit through the calibration circuit; and finally, the digital logic circuit completes final digital output.

6 Claims, 6 Drawing Sheets

(56) References Cited

FOREIGN PATENT DOCUMENTS

| | | | |
|---|---|---|---|
| CN | 112994453 | A | 6/2021 |
| CN | 113055006 | A | 6/2021 |
| CN | 115102548 | A | 9/2022 |
| CN | 115882861 | A | 3/2023 |

* cited by examiner

TIME SIGNAL PROCESSOR BASED ON MULTIPLYING PHASE INTERPOLATION CIRCUIT

CROSS-REFERENCE TO THE RELATED APPLICATIONS

This application is a continuation application of International Application No. PCT/CN2023/117651, filed on Sep. 8, 2023, which is based upon and claims priority to Chinese Patent Application No. 202310903661.4, filed on Jul. 23, 2023, the entire contents of which are incorporated herein by reference.

TECHNICAL FIELD

The invention relates to a time signal processor based on multiplying phase interpolation circuit, and belongs to the technical field of signal processing.

BACKGROUND

Time signal processing circuits realize the conversion function of time signals and different types of signals, and play a vital role in communication systems, aerospace, medical equipment and other fields. High-performance time signal processing circuits can be applied to higher-end and more sophisticated scenarios, such as military industry and radar systems. Conversion rate, conversion accuracy, and power consumption are important indicators for measuring the performance of time signal processing circuits, but there are usually constraints on speed, accuracy, and power consumption. The improvement of time signal quantification accuracy will help accelerate the resolution of existing technical barriers and realize time signal processing circuits with high speed, high precision, and low power consumption.

Time signal processing circuits are used in key modules, such as time-to-digital conversion circuits, phase-locked loop circuits, time domain analog-to-digital conversion circuits, etc., which use fixed time delays to divide the input time into multiple quantization intervals. Compare the phase information to obtain a series of digital codes and output them. The fixed time delay, that is, the quantization accuracy of the time signal processing circuit, is an important parameter to measure the accuracy of the time signal processing circuit. In the delay chain structure, the fixed time delay is composed of buffers, and the quantization accuracy is the delay of one buffer. Due to process limitations, the quantization accuracy is at a low level. In order to improve the quantification accuracy of the time signal, the vernier structure uses two transmission paths with different time delays to realize the conversion of the time signal. The time signal quantification accuracy is the delay difference of two different delay units, but it is affected by the process and the accuracy is at a medium level despite the influence of power supply voltage and temperature changes. Therefore, improving the time signal quantization accuracy of time signal processing circuits is an urgent technical difficulty that needs to be solved. It is also the focus of the design of high-performance time signal processing circuits and has a crucial impact on the performance improvement of related applications in the field of signal processing.

The invention can overcome the shortcomings of the existing technology and further improve and enhance the speed, quantization accuracy and other performance levels of the time signal processing circuit.

SUMMARY

The invention proposes a time signal processor based on multiplying phase interpolation circuit, which realizes the quantization function of the time input signal and outputs it as a digital signal. First, the time signal processing circuit quantifies the input time signal to obtain a series of digital code outputs; secondly, the time signal processing circuit is fed back and compensated through the calibration circuit; finally, the digital logic circuit completes the final digital output.

Compared with the existing technology, the present invention can improve the conversion speed and efficiency, obtain higher time quantification accuracy, and realize more efficient time signal processing functions.

The above objectives are achieved through the following technical solutions:

A time signal processor based on multiplying phase interpolation circuit is consists of three parts: a time signal processing circuit, a calibration circuit, and a digital logic circuit, which realizes the conversion process of time input signal to digital output signal.

Figure 2:
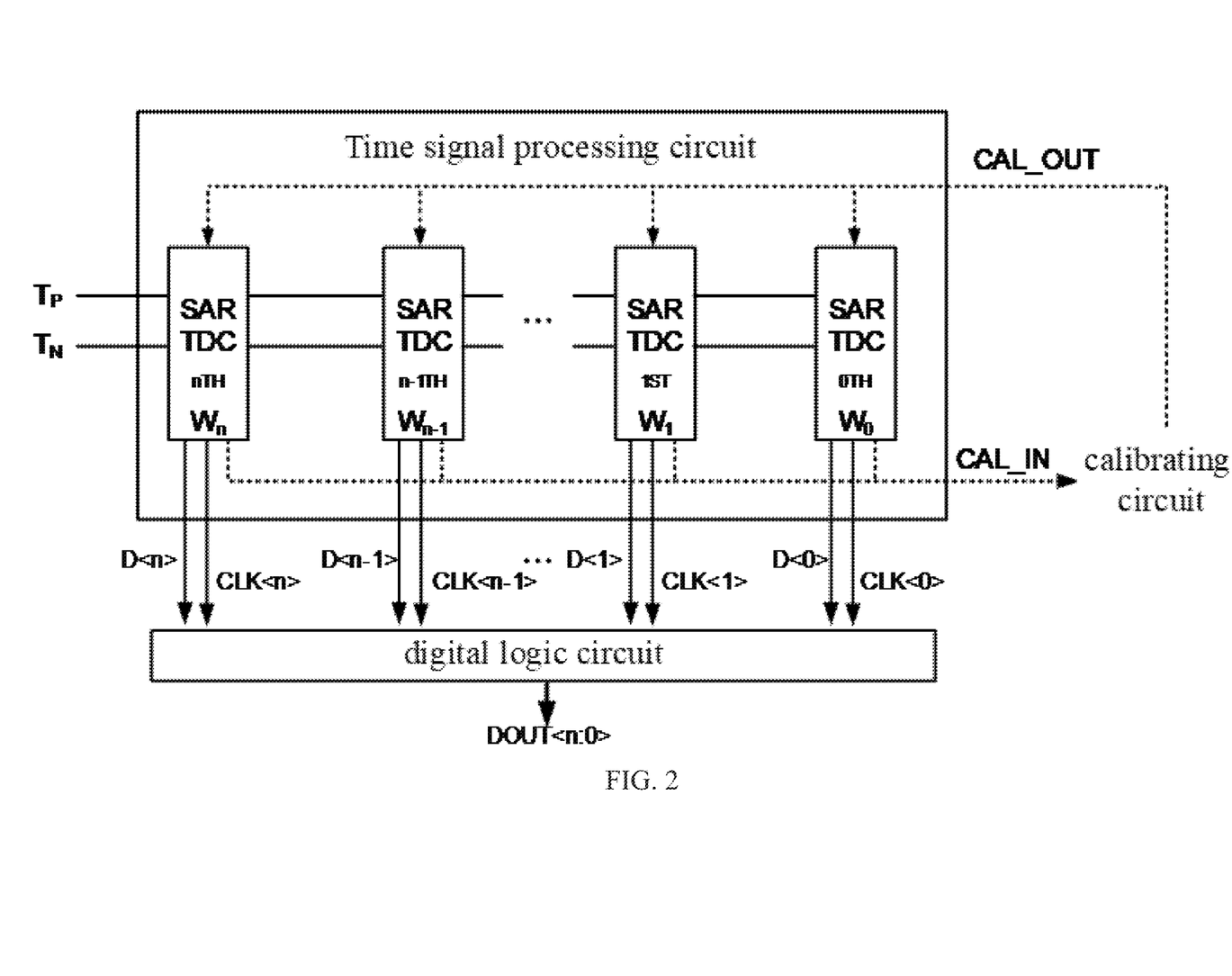
FIG. 2 is a schematic structural diagram of the time signal processing circuit of the present invention.

The time signal processing circuit includes (n+1)-level successive approximation time signal processing sub-circuits $SARTDC_{nTH}$, $SARTDC_{n-1TH}$, $SARTDC_{1ST}$, and $SARTDC_{0TH}$. Each sub-SARTDC module is cascaded. Each level of digital code quantifies the amount of time with weights $W_n$, $W_{n-1}$, $W_1$, and $W_0$, and completes time-to-digital signal conversion in a pipeline manner. The input terminals of $SARTDC_{nTH}$ are time input signals $T_P$ and $T_N$, and their phase difference can be expressed as the time amount $T_{res}$. The sub-SARTDC of each stage outputs the digital code D<n:0> and the corresponding clock signal CLK<n:0> to the digital logic circuit, and outputs the calibration signal CAL_IN to the calibration circuit.

Figure 3:
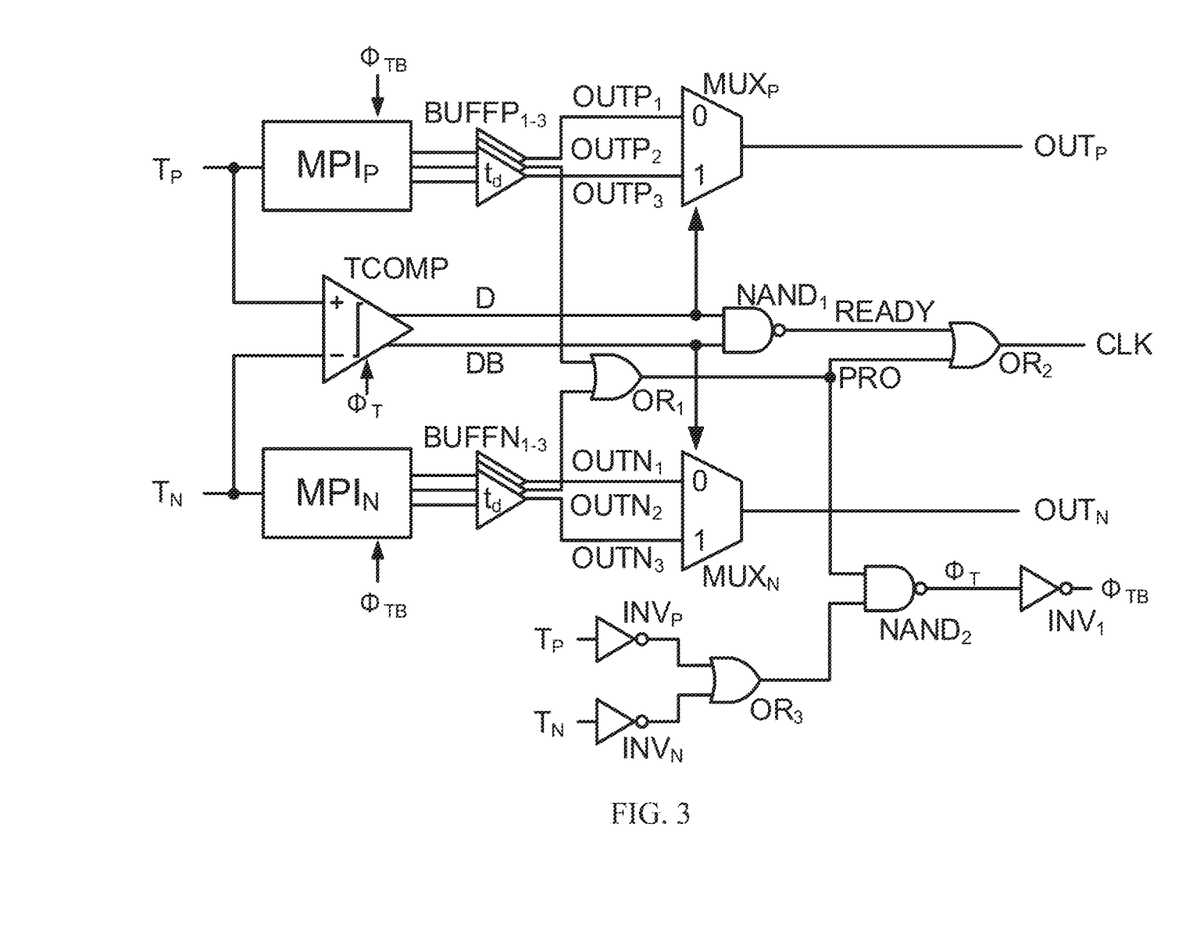
FIG. 3 is a schematic structural diagram of the sub-SARTDC circuit of the present invention.

The sub-SARTDC circuit has a differential structure and is divided into two paths, P and N. Each path contains multiplication interpolation modules $MPI_P$ and $MPI_N$, delay modules $BUFFP_{1-3}$ and $BUFFN_{1-3}$, and selectors $MUX_P$ and $MUX_N$. The sub-SARTDC circuit includes time comparator TCOMP, NAND gate, OR gate, inverter and other digital logic units. The input end of the $MPI_P$ is connected to the input signal $T_P$ of the sub-SARTDC, and the output end is connected to the delay modules $BUFFP_{1-3}$ respectively. The input end of the $MPI_N$ is connected to the input signal $T_N$ of the sub-SARTDC, and the output end is connected to the delay modules $BUFFN_{1-3}$ respectively. The outputs of the delay module $BUFFP_{1-3}$ are $OUTP_1$, $OUTP_2$, and $OUTP_3$; the outputs of the delay module $BUFFN_{1-3}$ are $OUTN_1$, $OUTN_2$, and $OUTN_3$. Among them, $MPI_P$ and $MPI_N$ modules are reset by $\Phi_{TB}$. The two input terminals of the time comparator TCOMP are respectively connected to the input signals $T_P$ and $T_N$ of the sub-SARTDC, and the output signals are D and DB. The reset operation of the time comparator TCOMP is controlled by $\Phi_T$. The inputs of the selector $MUX_P$ are $OUTP_1$ and $OUTP_3$, the control terminal is D, and the output is $OUT_P$; the inputs of the selector $MUX_N$ are $OUTN_1$ and $OUTN_3$, the control terminal is DB, and the output is $OUT_N$. $OUT_P$ and $OUT_N$ are connected to the input terminal of the subsequent sub-SARTDC. The $OUTP_2$ and $OUTN_2$ are connected to the input terminal of the OR gate $OR_1$, and the output terminal of the OR gate $OR_1$ is PRO. The output terminals D and DB of the comparator TCOMP are connected to the NAND gate $NAND_1$.

The output terminal of the NAND gate $NAND_1$ is READY, and READY and PRO are jointly connected to the OR gate $OR_2$. The output terminal of the OR gate $OR_2$ is the CLK signal, and is passed to the digital logic circuit as the output signal CLK of the sub-SARTDC. The input signals $T_P$ and $T_N$ are respectively connected to the input terminals of the inverters $INV_P$ and $INV_N$, and the output terminals of the inverters $INV_P$ and $INV_N$ are connected to the input terminal of the OR gate $OR_3$. The output terminal of the OR gate $OR_3$ and the PRO signal are connected to the input terminal of the NAND gate $NAND_2$, the output terminal $\Phi_T$ of the NAND gate $NAND_2$ is connected to the input terminal of the inverter $INV_1$, and the output terminal of the inverter $INV_1$ is $\Phi_{TB}$. The sub-SARTDC circuit outputs the comparison signal D and the clock signal CLK to the digital logic circuit and controls it to convert the digital code.

Figure 4:
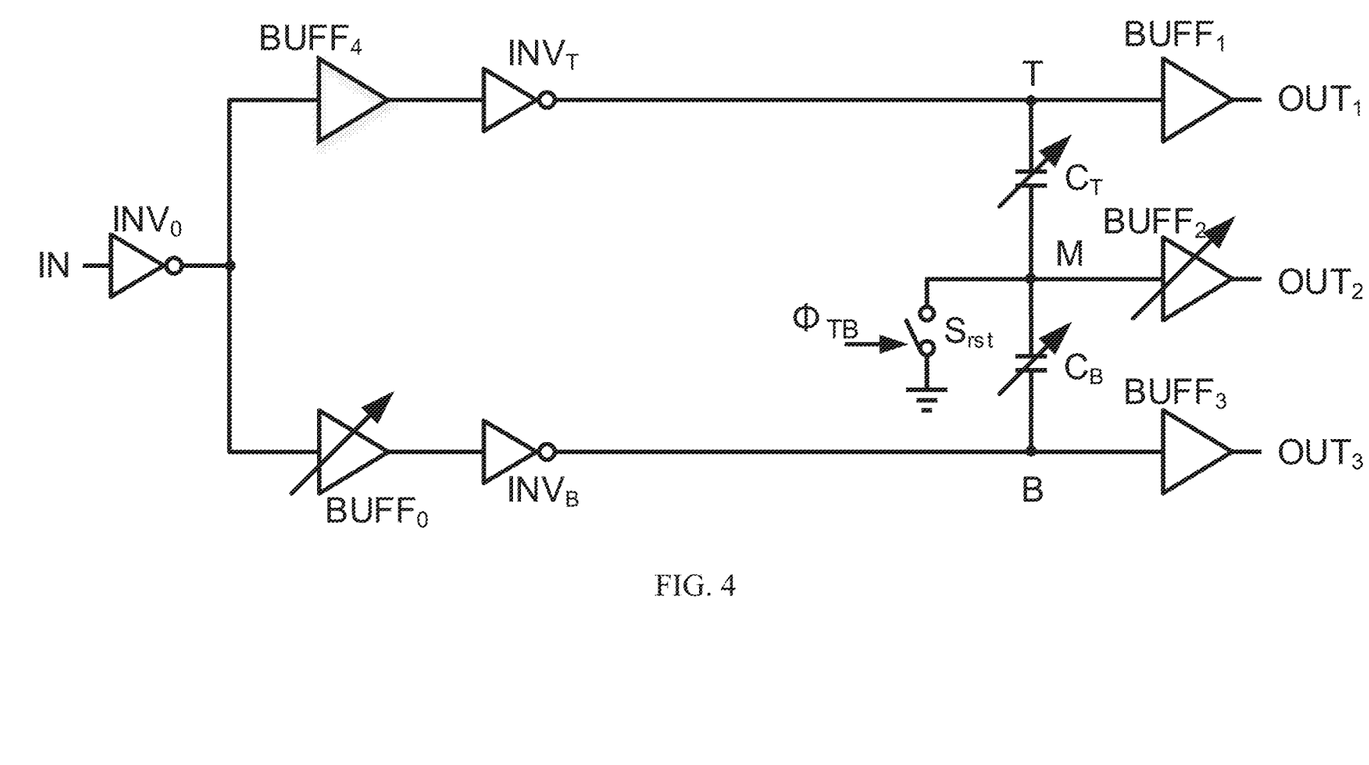
FIG. 4 is a schematic structural diagram of the multiplication interpolation circuit of the present invention.

The multiplicative interpolation module (MPI) includes inverters $INV_0$, $INV_T$, $INV_B$, variable delay modules $BUFF_0$, $BUFF_2$, buffers $BUFF_1$, $BUFF_3$, $BUFF_4$, variable capacitors $C_T$, $C_B$, and reset switch $S_{rst}$. The input terminal of the inverter $INV_0$ is connected to the input signal IN of the multiplication interpolation module, and the output terminal is connected to the input terminal of the buffer BUFF4 and the input terminal of the variable delay module $BUFF_0$. The output terminal of the buffer $BUFF_4$ is connected to the input terminal of the inverter $INV_T$. The output terminal of the variable delay module $BUFF_0$ is connected to the input terminal of the inverter $INV_B$. The output terminal of the inverter $INV_T$ and the upper plate of the variable capacitor $C_T$ are jointly connected to the node T. The output terminal of the inverter $INV_B$ and the lower plate of the variable capacitor $C_B$ are jointly connected to the node B. The lower plate of the variable capacitor $C_T$, the upper plate of $C_B$ and one end of the reset switch $S_{rst}$ are jointly connected to the node M. The other end of the reset switch $S_{rst}$ is connected to the ground VSS, and is controlled to close and turn off by $\Phi_{TB}$. The input terminal of the buffer $BUFF_1$ is connected to the node T, and the output terminal is $OUT_1$ signal; the input terminal of the buffer $BUFF_3$ is connected to the node B, and the output terminal is $OUT_3$ signal; the input terminal of the variable delay module $BUFF_2$ is connected to the node M, and the output terminal is $OUT_2$ signal. The $OUT_1$ signal, $OUT_2$ signal, and $OUT_3$ signal are the output signals of the multiplying interpolation module. The circuit structure of the variable delay modules $BUFF_0$ and $BUFF_2$ includes but is not limited to variable power supply voltage, variable bias voltage buffer, changing the number of delay unit cascades, changing the size or number of transistors to change the delay. The variable capacitor $C_T$ and $C_B$ structures include but are not limited to unit capacitors with different numbers of series/parallel connections or different capacitance values between nodes T, M, and B to change the capacitance between nodes T, M, and B.

Figure 6:
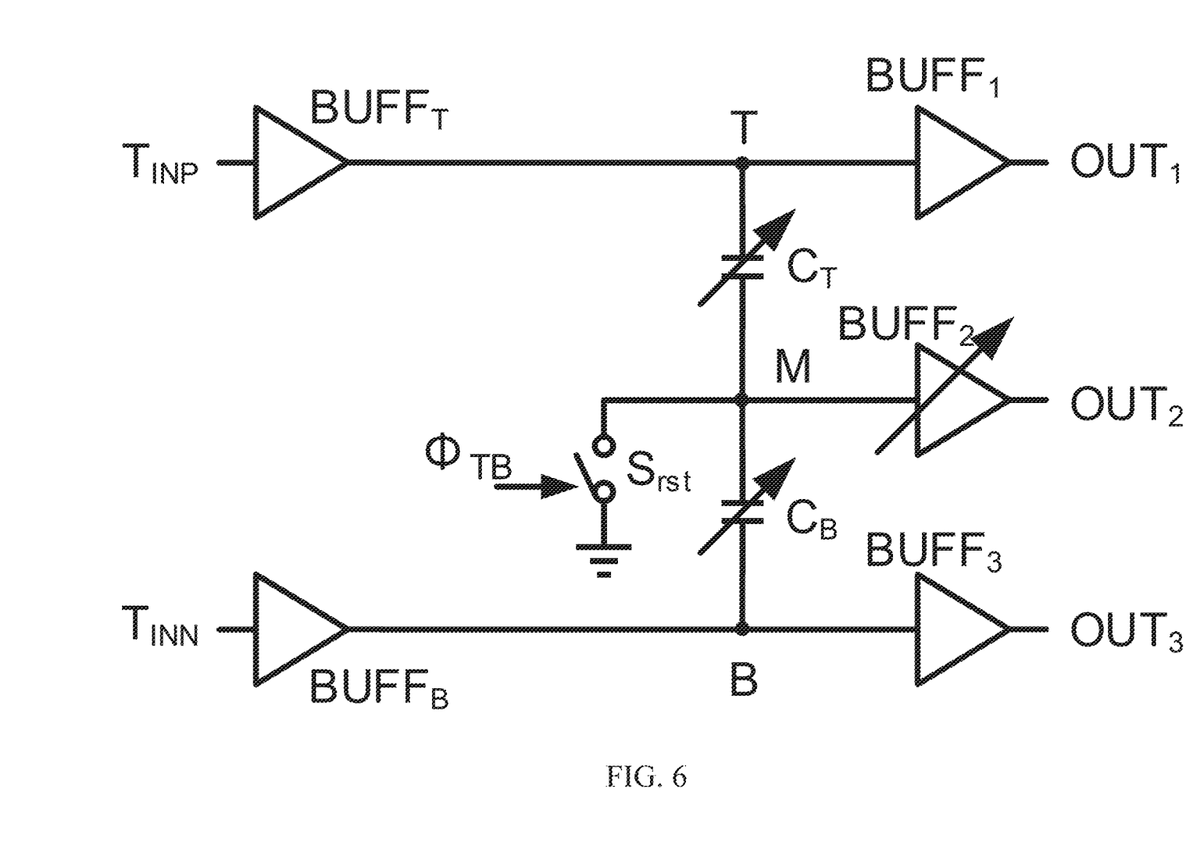
FIG. 6 is a schematic structural diagram of the doubling time amplification circuit of the present invention.

The modified structure of the doubling type interpolation module, that is, the doubling type time amplification circuit, includes buffers $BUFF_T$, $BUFF_B$, $BUFF_1$, $BUFF_3$, variable delay module $BUFF_2$, variable capacitors $C_T$, $C_B$, and reset switch $S_{rst}$. The input terminals of the buffers $BUFF_T$ and $BUFF_B$ are connected to the input signals $TIN_P$ and $TIN_N$ respectively, and the output terminals of the buffers $BUFF_1$ and $BUFF_3$ are connected to the nodes T and B respectively. The upper plate of the variable capacitor $C_T$ is connected to node T, and the lower plate is connected to node M. The upper plate of the variable capacitor $C_B$ is connected to node M, and the lower plate is connected to node B. One end of the reset switch $S_{rst}$ is connected to the node M, and the other end is connected to the ground VSS, and is controlled to close and turn off by $\Phi_{TB}$. The input terminal of the variable delay module $BUFF_2$ is connected to the node M, and the output terminal is connected to the output signal $OUT_2$. The output terminals of the buffers $BUFF_1$ and $BUFF_3$ are respectively connected to the output signals $OUT_1$ and $OUT_3$.

Figure 1:
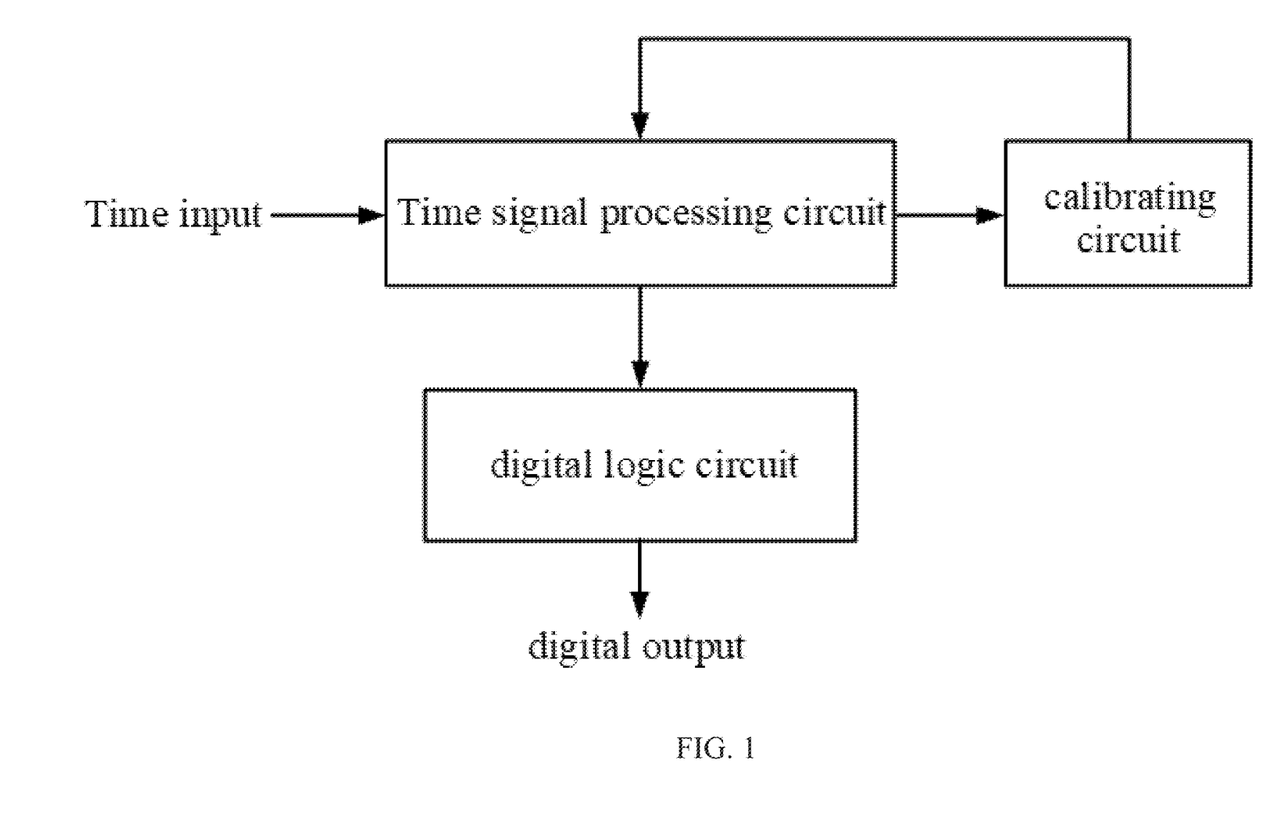
FIG. 1 is a structural diagram of the time signal processing system of the present invention.

The calibration circuit can change the voltage through analog modules such as low dropout regulator (LDO), delay-locked loop (DLL), and charge pump, and can also use digital logic modules such as switched capacitors to control circuit devices through digital codes. The input end of the calibration circuit is connected to the CAL_IN output signal of the time signal processing circuit, and the output signal CAL_OUT is fed back to the time signal processing circuit to complete the calibration work in the time domain.

The digital logic circuit realizes digital signal integration of time input signals in different cycles, and its operation is controlled by the output signals D<n:0> and CLK<n:0> of the time signal processing circuit to obtain synchronization output digital code DOUT<n:0> within the same conversion cycle.

A time signal processor based on multiplying phase interpolation circuit of the present invention realizes quantization of time input signals and outputs them as digital signals. The time signal processing circuit of the present invention adopts a pipeline operation system, which significantly improves the conversion speed and alleviates the limiting relationship between conversion speed and resolution; at the same time, the multiplicative interpolation module has a simple structure and has the characteristics of reducing the amount of time, thereby achieving a faster high time quantization accuracy; thanks to the assistance of the calibration circuit, the conversion accuracy of the time domain circuit is improved; finally, the digital logic circuit integrates the digital codes of different periods into synchronous digital output to achieve a high-performance time signal processing circuit.

BRIEF DESCRIPTION OF THE DRAWINGS

Embodiments of the invention are illustrated by means of practical examples and are not limited by the drawings. Similar reference numbers in the figures may identify similar elements or modules. The components and circuit modules in the figures are illustrated for simplicity and clarity and may not necessarily be drawn to scale.

DETAILED DESCRIPTION OF THE EMBODIMENTS

The present invention proposes a time signal processor based on multiplying phase interpolation circuit, showing its system structure and the circuit structure of each main module, including a time signal processing circuit, a multiplicative interpolation circuit (MPI), a calibration circuit, and digital logic Circuit; an embodiment showing the calibration of the multiplicative interpolation circuit; and an embodiment of the multiplicative time amplification circuit based on a modified structure of the multiplicative interpolation circuit.

FIG. 1 is a structural diagram of the time signal processing system of the present invention, including a time signal processing circuit, a calibration circuit, and a digital logic circuit. The time signal processing circuit quantifies the time input signal and transmits the output signal to the calibration circuit and digital logic circuit; the calibration circuit uses a negative feedback mechanism to implement the calibration algorithm of the time signal, improving the accuracy of the time signal processing circuit and achieving robust design; The digital logic circuit outputs digital code from the output signal of the time signal processing circuit; through the cooperation of the above modules, the processing of the time signal is finally completed.

FIG. 2 is a schematic structural diagram of the time signal processing circuit of the present invention. The time signal processing circuit is a successive approximation structure, consisting of multiple sub-SARTDCs cascaded, and completes the conversion of time signals to digital signals in a pipeline manner. The phase difference of the differential time signals $T_P$ and $T_N$ is the time margin $T_{res}$. The time margin $T_{res}$ is reduced and quantized in each sub-SARTDC. The output signal CAL_IN of the time signal processing circuit is passed to the calibration circuit, and is fed back by the output signal CAL_OUT of the calibration circuit. The time signal processing circuit converts in a pipeline manner. The output digital signal D<n:0> is the comparison result of different periods. CLK<n:0> is passed to the digital logic circuit, which is integrated into digital code output DOUT<n:0> of the same period through the digital logic circuit.

The working principle of the time signal processing circuit is as follows: the differential time signals $T_P$ and $T_N$ are input into the sub-SARTDC and compared through the time comparator. According to the comparison results, the time signals are transmitted in the $T_P$ and $T_N$ transmission paths with weights $W_n$, $W_{n-1}$, $W_1$ and $W_0$ increase/decrease by the same amount of time, that is, change the time margin $T_{res}$. After successively passing through each sub-SARTDC, the successive approximation quantization process in the time domain can be realized. The weights $W_n$, $W_{n-1}$, $W_1$, and $W_0$ of $SARTDC_{nTH}$, $SARTDC_{n-1TH}$, $SARTDC_{1ST}$, and $SARTDC_{0TH}$ are also represented as the weights of the comparison results in each level of sub-SARTDC.

In order to improve the time domain conversion accuracy and achieve PVT robustness design, combined with the calibration scheme, the CAL_IN signal of the time signal processing circuit is transmitted to the calibration circuit to provide feedback to the sub-SARTDC. Each sub-SARTDC outputs the comparison result D generated during the quantization process and the trigger clock CLK. The digital code of the successive approximation time signal processing circuit is integrated into a synchronous digital output through the digital logic circuit.

FIG. 3 is a schematic structural diagram of the sub-SARTDC circuit of the present invention. The conversion principle of sub-SARTDC is: the differential time input signals $T_P$ and $T_N$ are transmitted along two independent paths respectively. The two transmission paths are symmetrical to each other, and the time margin $T_{res}$ is the phase difference between $T_P$ and $T_N$. This circuit obtains time signals $OUTP_1$, $OUTP_2$, and $OUTP_3$ through the multiplication interpolation circuit $MPI_P$, and the $MPI_P$ reset process is controlled by $\Phi_{TB}$. This circuit obtains time signals $OUTN_1$, $OUTN_2$, and $OUTN_3$ through the multiplication interpolation circuit $MPI_N$, and the $MPI_N$ reset process is controlled by $\Phi_{TB}$. $T_P$ and $T_N$ are input to the time comparator TCOMP, which is a dynamic comparator structure, and its reset process is controlled by $\Phi_T$. D and DB are the comparison results of the time comparator TCOMP, which are output to the selection terminals of the selectors $MUX_P$ and $MUX_N$. D controls $MUX_P$ to select the input signals $OUTP_1$ and $OUTP_3$ and outputs $OUTP$; DB controls $MUX_N$ to select the input signals $OUTN_1$ and $OUTN_3$ and outputs $OUT_N$, finally realizing the addition and subtraction operations in the time domain. The time quantification process is explained in detail by taking the P end as an example: $T_P$ passes through the multiplication interpolation circuit $MPI_P$ to obtain three time output signals. The connected delay modules $BUFFP_{1-3}$ compensate for the comparison delay of TCOMP, so that $OUTP_1$ and $OUTP_3$ are compared in time. After TCOMP completes the comparison, it is passed to the selector $MUX_P$. The time signals $OUTP_1$, $OUTP_2$, and $OUTP_3$ are three square wave signals, and the $OUTP_2$ phase is located in the middle of the $OUTP_1$ and $OUTP_3$ phases. The time interval between $OUTP_1$ and $OUTP_3$ is the time quantization accuracy $T_W$ of this level SARTDC, which can be expressed as weight $W_n$. At this time, the time input $T_P$ can be represented by $OUTP_2$. Compared with $OUTP_2$, $OUTP_1$ can be regarded as subtracting the $T_W/2$ delay, and $OUTP_3$ can be regarded as adding the $T_W/2$ delay, realizing addition and subtraction operations in the time domain. If $T_P$ is input before $T_N$, D is high level and DB is low level. The selector $MUX_P$ selects $OUTP_3$ among the input signals $OUTP_1$ and $OUTP_3$ and outputs it as $OUT_P$. Similarly, the selector $MUX_N$ selects $OUTN_1$ and outputs it as $OUT_N$. Addition is made to $T_P$, subtraction is made to $T_N$, and the time margin $T_{res}$ changes to $T_W$. This process fully demonstrates the addition and subtraction operation process of the differential time signal, that is, the principle of successive approximation quantization in the time domain.

The reset process and clock generation process are completed by a series of logic units in the sub-SARTDC circuit. The first is the trigger clock CLK of the comparison result. CLK is generated by the READY and PRO signals through the OR gate $OR_2$. The READY signal is generated by the comparison results D and DB of TCOMP through the NAND gate $NAND_1$. It indicates the end of the comparison process and can trigger the output of the comparison result. In order to avoid comparison failure due to too long comparison time of TCOMP, the present invention designs a clock PRO that plays a protective role. The PRO clock is generated by $OUTP_2$ and $OUTN_2$ through the OR gate $OR_1$. Followed by the reset clock $\Phi_T$ of the time comparator TCOMP. The input signals $T_P$ and $T_N$ are input to the OR gate $OR_3$ through the inverters $INV_P$ and $INV_N$, and the output signal and the PRO signal are input to the NAND gate $NAND_2$ to obtain $\Phi_T$. After the signal conversion of the sub-SARTDC is completed, the PRO signal becomes high level, and $\Phi_T$ resets TCOMP. Finally, there is the reset clock $\Phi_{TB}$ of the multiplication-type interpolation circuit. $\Phi_{TB}$ is obtained from the output of $\Phi_T$ through inverter $INV_1$. In summary, the modules of the sub-SARTDC cooperate with each other to complete the conversion of time signals.

FIG. 4 is a schematic structural diagram of the multiplicative interpolation circuit of the present invention. The multiplicative interpolation circuit of the present invention is a key module of the overall time signal processing circuit and plays a decisive role in time domain resolution and conversion accuracy. The multiplicative interpolation module has a time signal reduction function, which can subdivide the input time signal into multiple output time signals with smaller intervals. Different from the traditional inverter-based interpolation circuit, the multiplication type interpolation circuit of the present invention adds a variable capacitor, which can further improve the time accuracy.

The working principle of the multiplication interpolation circuit of the present invention is: first, the reset switch $S_{rst}$ is turned off, the input signal IN is transferred to the inverter $INV_0$ and then its phase is reversed, and the output signal of $INV_0$ is transferred to the input terminal of the buffer $BUFF_4$ and the variable delay module $BUFF_0$. The flipped time signal is passed to the inverter $INV_T$ after passing through the buffer $BUFF_4$, and is passed to the inverter $INV_B$ after passing through the variable delay module $BUFF_0$. At this time, the phase difference between the signals at nodes T and B is the delay difference to between the variable delay module $BUFF_0$ and the buffer $BUFF_4$. Secondly, the output signals of the inverters $INV_T$ and $INV_B$ charge and discharge the variable capacitors $C_T$ and $C_B$. According to the principle of capacitor series connection, the voltage value at point M is in the middle of the voltage values at point T and point B. Then, the signals of nodes T, M, and B are output through buffers $BUFF_1$, $BUFF_3$ and variable delay module $BUFF_2$, and the output signals are $OUT_1$, $OUT_2$, and $OUT_3$. Finally, the reset switch $S_{rst}$ is closed, clearing the charge of the M node.

The time reduction function of the multiplication interpolation circuit of the present invention is realized based on the state response characteristics of the capacitor during charging and discharging. After the level of node T changes, the variable capacitors $C_T$ and $C_B$ can be regarded as a whole and charged by the signal of node T, and the voltage of node B changes with the signal of node T. After the delay $t_0$, the voltage of the inverter $INV_B$ driving node B accelerates. In this process, the signal at point M is always in the middle phase of the T and B signals, realizing the interpolation function. The phase difference between the T and B signals realizes the time reduction characteristic of this multiplication interpolation circuit. The multiplicative interpolation circuit of the present invention can achieve calibration by changing the delays of variable delay modules $BUFF_0$ and $BUFF_2$ and changing the sizes of variable capacitors $C_T$ and $C_B$, improve time domain accuracy, and achieve PVT robust design.

Figure 5:
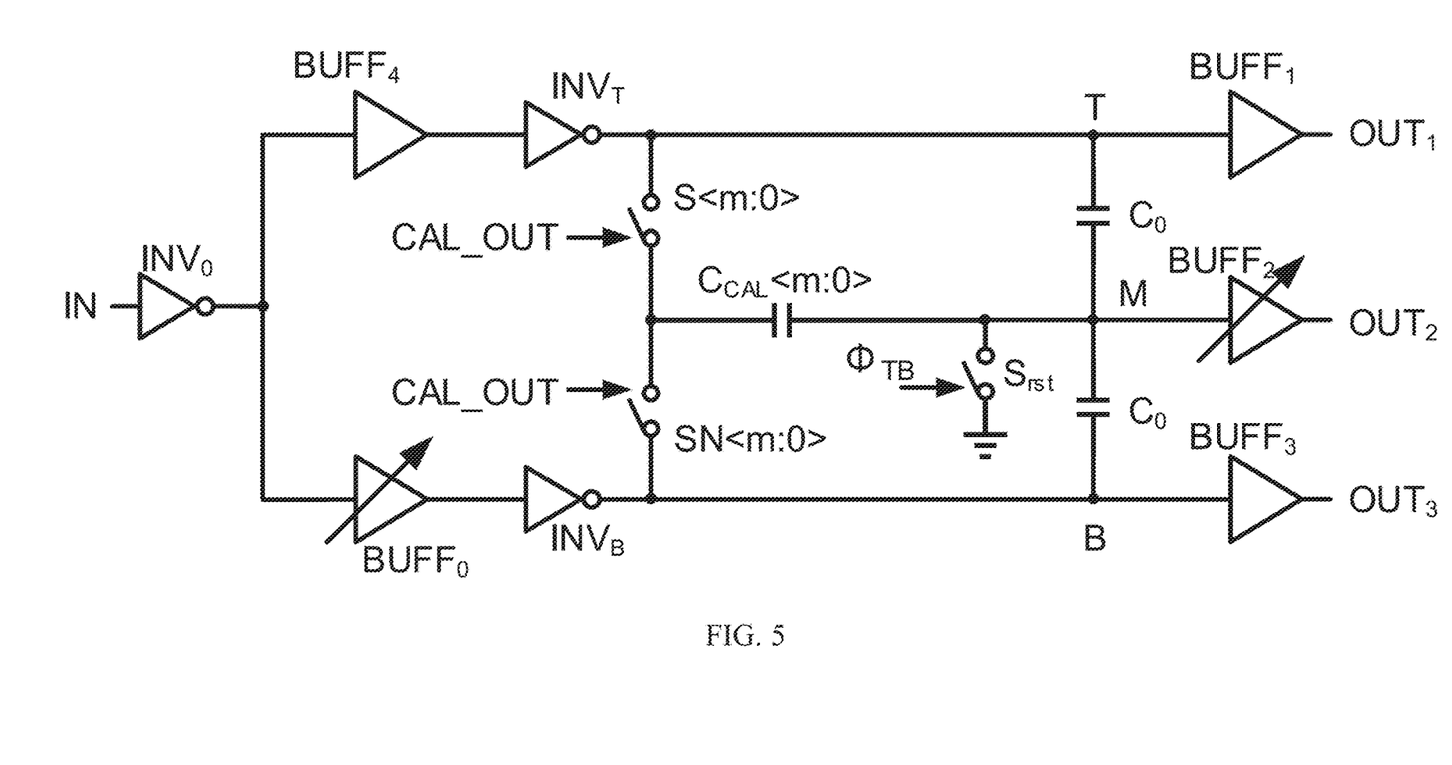
FIG. 5 is a structural diagram of the calibration principle of the multiplication interpolation circuit of the present invention.

FIG. 5 is a possible structural diagram of the calibration principle of the multiplication interpolation circuit. In order to realize that $OUT_2$ is in the intermediate phase of OUT and $OUT_3$, the delay of $BUFF_2$ and the value of the variable capacitor can be changed; change the delay of $BUFF_0$ in order to achieve high-precision time resolution. The present invention can change the phase of $OUT_2$ so that it is in the middle position by changing the power supply voltage VDD and bias voltage of $BUFF_2$, or its module cascade number, transistor size, etc. The calibration of the present invention is achieved by changing the capacitance between nodes T and M and the capacitance between nodes B and M. $C_0$ can be regarded as a fixed capacitor, CCAL<m: 0> is an m+1-bit calibration capacitor, and its access mode is controlled by switches S<m: 0> and SN<m: 0>. The switches S<m: 0> and SN<m: 0> are controlled to close and turn off by the CAL_OUT output signal of the calibration circuit. To illustrate with an example: when S<m: 0> are both closed and SN<m: 0> are both turned off, the capacitance value between nodes T and M is C0+ (m+1)×CCAL, and the capacitance value between nodes B and M is C0+ (m+1)× CCAL. The capacitance value is $C_0$. At this time, more charges are stored between nodes T and M than between nodes B and M, and the phase of $OUT_2$ moves forward. The above solution can realize the phase adjustment of the multiplication interpolation circuit, so that $OUT_2$ is in the middle of the phases of $OUT_1$ and $OUT_3$.

The present invention can increase or decrease T, The phase difference of the B signal. The delay of $BUFF_0$ is reduced, which reduces the phase difference between $OUT_1$ and $OUT_3$ and improves the time quantization accuracy. The calibration scheme of the present invention includes but is not limited to the above circuit design scheme. Other circuit structures that change the delay belong to the calibration scheme of the present invention.

The calibration circuit of the present invention includes but is not limited to analog calibration circuits represented by changing voltages, such as LDO, DLL, charge pump and other modules; it may also include digital calibration circuits represented by changing digital codes, such as digital logic modules such as switched capacitors.

The output signal CAL_OUT of the calibration circuit is fed back to the time signal processing circuit to complete the calibration work in the time domain.

FIG. 6 is a modified structure of the doubling type interpolation circuit of the present invention and a schematic structural diagram of the doubling type time amplification circuit. The two input signals $T_{INP}$ and $T_{INN}$ are independently transmitted as input signals of the buffers $BUFF_T$ and $BUFF_B$. The $BUFF_0$ delay of the multiplicative interpolation circuit is included in the phase difference of the two input signals $T_{INP}$ and $T_{INN}$. The output signals of the buffers $BUFF_T$ and $BUFF_B$ charge and discharge the variable capacitors $C_T$ and $C_B$. The reset switch $S_{rst}$ controls the reset process of the node M by the clock $\Phi_{TB}$. The working principle of the doubling time amplification circuit is similar to that of the doubling interpolation circuit, and the reduction function of the time signal is achieved with the help of variable capacitors Cr and $C_B$.

The above description is not a limitation of the present invention, and the present invention is not limited to the above examples. Changes, modifications, additions or substitutions made by those skilled in the art within the essential scope of the present invention should also fall within the protection scope of the present invention.

The invention claimed is:

1. A time signal processor based on a multiplying phase interpolation circuit, comprising a time signal processing circuit, a calibration circuit, and a digital logic circuit, wherein the time signal processing circuit, the calibration circuit, and the digital logic circuit realizes a conversion process of a time input signal to a digital output signal;

the time signal processing circuit comprises (n+1)-level successive approximation time signal processing sub-circuits $SARTDC_{nTH}$, $SARTDC_{n-1TH}$, $SARTDC_{1ST}$, and $SARTDC_{0TH}$; each sub-SARTDC module is cascaded; each level of digital code quantifies an amount of time with weights $W_n$, $W_{n-1}$, $W_1$, and $W_0$, and completes a time-to-digital signal conversion in a pipeline manner; input terminals of the $SARTDC_{nTH}$ are time input signals $T_P$ and $T_N$, and a phase difference of the time input signals $T_P$ and $T_N$ is allowed to be expressed as a time amount $T_{res}$; the sub-SARTDC of each stage outputs a digital code D<n:0> and a clock signal CLK<n:0> corresponding to the digital code D<n:0> to the digital logic circuit, and outputs a calibration signal CAL_IN to the calibration circuit;

the calibration circuit is allowed to change the voltage through analog modules comprising low dropout regulator (LDO), delay-locked loop (DLL), and a charge pump, and is further allowed to configure digital logic modules comprising switched capacitors to control circuit devices through the digital codes; an input end of the calibration circuit is connected to an output signal CAL_IN of the time signal processing circuit, and an output signal CAL_OUT is fed back to the time signal processing circuit to complete a calibration work in a time domain;

the digital logic circuit realizes a digital signal integration of time input signals in different cycles, and an operation of the digital logic circuit is controlled by the output signals D<n:0> and CLK<n:0> of the time signal processing circuit to obtain a synchronization output digital code DOUT<n:0> within the same conversion cycle.

2. The time signal processor based on the multiplying phase interpolation circuit according to claim 1, wherein the sub-SARTDC has a differential structure and is divided into two paths, P and N;

each of the two paths comprises multiplication interpolation modules $MPI_P$ and $MPI_N$, delay modules $BUFFP_{1-3}$ and $BUFFN_{1-3}$, and selectors $MUX_P$ and $MUX_N$;

the sub-SARTDC comprises a time comparator TCOMP, a NAND gate, an OR gate, an inverter and other digital logic units;

an input end of the $MPI_P$ is connected to the input signal $T_P$ of the sub-SARTDC, and an output end of the $MPI_P$ is connected to the delay modules $BUFFP_{1-3}$, respectively;

an input end of the $MPI_N$ is connected to the input signal $T_N$ of the sub-SARTDC, and an output end of the $MPI_N$ is connected to the delay modules $BUFFN_{1-3}$, respectively;

outputs of the delay module $BUFFP_{1-3}$ are $OUTP_1$, $OUTP_2$, and $OUTP_3$;

outputs of the delay module $BUFFN_{1-3}$ are $OUTN_1$, $OUTN_2$, and $OUTN_3$;

wherein the $MPI_P$ and the $MPI_N$ are reset by $\Phi_{TB}$;

two input terminals of the time comparator TCOMP are respectively connected to the input signals $T_P$ and $T_N$ of the sub-SARTDC, and output signals of the time comparator TCOMP are D and DB;

a reset operation of the time comparator TCOMP is controlled by $\Phi_T$;

inputs of the selector $MUX_P$ are the $OUTP_1$ and the $OUTP_3$, a control terminal of the selector $MUX_P$ is D, and an output of the selector $MUX_P$ is $OUT_P$;

inputs of the selector $MUX_N$ are the $OUTN_1$ and the $OUTN_3$, a control terminal of the selector $MUX_N$ is DB, and an output of the selector $MUX_N$ is $OUT_N$;

the $OUT_P$ and the $OUT_N$ are connected to the input terminal of the subsequent sub-SARTDC;

the $OUTP_2$ and the $OUTN_2$ are connected to an input terminal of an OR gate $OR_1$, and an output terminal of the OR gate $OR_1$ is PRO;

the output terminals D and DB of the time comparator TCOMP are connected to a NAND gate $NAND_1$;

an output terminal of the NAND gate $NAND_1$ is READY, and READY and PRO are jointly connected to an OR gate $OR_2$;

an output terminal of the OR gate $OR_2$ is a CLK signal, and is passed to the digital logic circuit as an output signal CLK of the sub-SARTDC;

the input signals $T_P$ and $T_N$ are respectively connected to input terminals of the inverters $INV_P$ and $INV_N$, and output terminals of the inverters $INV_P$ and $INV_N$ are connected to an input terminal of an OR gate $OR_3$;

an output terminal of the OR gate $OR_3$ and the PRO signal are connected to an input terminal of a NAND gate $NAND_2$, an output terminal $\Phi_T$ of the NAND gate $NAND_2$ is connected to an input terminal of an inverter $INV_1$, and an output terminal of the inverter $INV_1$ is $\Phi_{TB}$; and the sub-SARTDC outputs a comparison signal D and the clock signal CLK to the digital logic circuit and controls the digital logic circuit to convert the digital code.

3. The time signal processor based on the multiplying phase interpolation circuit according to claim 1, wherein the MPI comprises inverters $INV_0$, $INV_T$, $INV_B$, variable delay modules $BUFF_0$, $BUFF_2$, buffers $BUFF_1$, $BUFF_3$, $BUFF_4$, variable capacitors $C_T$, $C_B$, and reset switch $S_{rst}$, an input terminal of the inverter $INV_0$ is connected to an input signal IN of the MPI, and an output terminal of the inverter $INV_0$ is connected to an input terminal of the buffer $BUFF_4$ and an input terminal of the variable delay module $BUFF_0$;

an output terminal of the buffer $BUFF_4$ is connected to an input terminal of the inverter $INV_T$;

an output terminal of the variable delay module $BUFF_0$ is connected to an input terminal of the inverter $INV_B$;

an output terminal of the inverter $INV_T$ and an upper plate of the variable capacitor $C_T$ are jointly connected to a node T;

an output terminal of the inverter $INV_B$ and a lower plate of the variable capacitor $C_B$ are jointly connected to a node B;

a lower plate of the variable capacitor $C_T$, an upper plate of the $C_B$ and a first end of the reset switch $S_{rst}$ are jointly connected to a node M;

a second end of the reset switch $S_{rst}$ is connected to a ground VSS, and is controlled to close and turn off by $\Phi TB$;

an input terminal of the buffer $BUFF_1$ is connected to the node T, and an output terminal of the buffer $BUFF_1$ is an $OUT_1$ signal;

an input terminal of the buffer $BUFF_3$ is connected to the node B, and an output terminal of the buffer $BUFF_3$ is an $OUT_3$ signal;

an input terminal of the variable delay module $BUFF_2$ is connected to the node M, and an output terminal of the variable delay module $BUFF_2$ is an $OUT_2$ signal; and the $OUT_1$ signal, the $OUT_2$ signal, and the $OUT_3$ signal are the output signals of the MPI.

4. The time signal processor based on the multiplying phase interpolation circuit according to claim 3, wherein a circuit structure of the variable delay modules $BUFF_0$ and $BUFF_2$ comprises a variable power supply voltage, a variable bias voltage buffer, changing a number of delay unit cascades, changing a size or number of transistors to change a delay.

5. The time signal processor based on the multiplying phase interpolation circuit according to claim 3, wherein structures of the variable capacitor $C_T$ and $C_B$ comprise unit capacitors with different numbers of series/parallel connections or different capacitance values between the nodes T, M, and B to change a capacitance between nodes T, M, and B.

6. The time signal processor based on the multiplying phase interpolation circuit according to claim 1, wherein a modified structure of the MPI, that is, a doubling type time amplification circuit, comprises buffers $BUFF_T$, $BUFF_B$, BUFF$_1$, BUFF$_3$, variable delay module BUFF$_2$, variable capacitors C$_T$, C$_B$, and reset switch S$_{rst}$;

input terminals of the buffers BUFF$_T$ and BUFF$_B$ are connected to input signals TIN$_P$ and TIN$_N$, respectively, and output terminals of the buffers BUFF$_1$ and BUFF$_3$ are connected to nodes T and B respectively;

an upper plate of the variable capacitor C$_T$ is connected to the node T, and a lower plate of the variable capacitor C$_T$ is connected to a node M;

an upper plate of the variable capacitor C$_B$ is connected to the node M, and a lower plate of the variable capacitor C$_B$ is connected to the node B;

a first end of the reset switch S$_{rst}$ is connected to the node M, and a second end of the reset switch S$_{rst}$ is connected to a ground VSS, and the second end of the reset switch S$_{rst}$ is controlled to close and turn off by $\Phi_{TB}$;

an input terminal of the variable delay module BUFF$_2$ is connected to the node M, and an output terminal of the variable delay module BUFF$_2$ is connected to an output signal OUT$_2$; and the output terminals of the buffers BUFF$_1$ and BUFF$_3$ are respectively connected to output signals OUT$_1$ and OUT$_3$.

\* \* \* \* \*